US006998635B2

(12) United States Patent
Sillmon et al.

(10) Patent No.: US 6,998,635 B2
(45) Date of Patent: Feb. 14, 2006

(54) TUNED BANDWIDTH PHOTOCATHODE FOR TRANSMISSION NEGATIVE ELECTRON AFFINITY DEVICES

(75) Inventors: Roger S. Sillmon, Troutville, VA (US); Arlynn W. Smith, Blue Ridge, VA (US); Rudy G. Benz, Daleville, VA (US)

(73) Assignee: ITT Manufacturing Enterprises Inc., Wilmington, DE (US)

( * ) Notice: Subject to any disclaimer, the term of this patent is extended or adjusted under 35 U.S.C. 154(b) by 0 days.

(21) Appl. No.: 10/443,564

(22) Filed: May 22, 2003

(65) Prior Publication Data

US 2004/0232403 A1 Nov. 25, 2004

(51) Int. Cl.
*H01L 29/12* (2006.01)

(52) U.S. Cl. .............................. 257/10; 257/11; 257/9; 257/21; 257/43; 257/184; 257/185; 313/542; 313/346; 313/366; 438/20

(58) Field of Classification Search .................... 257/9, 257/10, 11, 21, 43, 184, 185, 12, 13; 313/542, 313/346, 366; 438/2
See application file for complete search history.

(56) References Cited

U.S. PATENT DOCUMENTS

| | | | | | |
|---|---|---|---|---|---|
| 3,814,993 | A | * | 6/1974 | Kennedy | 357/30 |
| 4,599,632 | A | * | 7/1986 | Bethea et al. | 257/186 |
| 4,644,221 | A | * | 2/1987 | Gutierrez et al. | 313/373 |
| 5,023,511 | A | | 6/1991 | Phillips | |
| 5,084,780 | A | | 1/1992 | Phillips | |
| 5,233,183 | A | * | 8/1993 | Field | 250/214 VT |
| 5,710,435 | A | * | 1/1998 | Niigaki et al. | 257/11 |
| 5,932,966 | A | | 8/1999 | Schneider et al. | |
| 5,994,824 | A | | 11/1999 | Thomas et al. | |
| 6,005,257 | A | | 12/1999 | Estreraa et al. | |

FOREIGN PATENT DOCUMENTS

| | | | |
|---|---|---|---|
| DE | 33 10303 | A1 | 9/1984 |
| EP | 0 797 256 | A2 | 9/1997 |
| EP | 1 265 296 | A1 | 12/2002 |
| JP | 2001093407 | | 4/2001 |

* cited by examiner

*Primary Examiner*—Minhloan Tran
*Assistant Examiner*—Fazli Erdem
(74) *Attorney, Agent, or Firm*—RatnerPrestia

(57) ABSTRACT

A photocathode includes a first layer having a first energy band gap for providing absorption of light of wavelengths shorter than or equal to a first wavelength, a second layer having a second energy band gap for providing transmission of light of wavelengths longer than the first wavelength, and a third layer having a third energy band gap for providing absorption of light of wavelengths between the first wavelength and a second wavelength. The first wavelength is shorter than the second wavelength. The first, second and third layers are positioned in sequence between input and output sides of the photocathode.

17 Claims, 4 Drawing Sheets

TUNED BANDWIDTH PHOTOCATHODE FOR TRANSMISSION NEGATIVE ELECTRON AFFINITY DEVICES

TECHNICAL FIELD

The present invention relates, in general, to a transmission photocathode device and, more specifically, to a negative electron affinity (NEA) transmission device, whose spectral response may be tuned over a broad spectral range.

BACKGROUND OF THE INVENTION

There are many devices for detecting radiation. In one type of detector, photocathodes are used with microchannel plates (MCPs) to detect low levels of electromagnetic radiation. Photocathodes emit electrons in response to exposure to photons. The electrons can then be accelerated by electrostatic fields toward a microchannel plate. The microchannel plate produces cascades of secondary electrons in response to incident electrons. A receiving device then receives the secondary electrons and sends out a signal responsive to the electrons. Since the number of electrons emitted from the microchannel plate is much larger than the number of incident electrons, the signal produced by the device is amplified for viewing by an observer.

One example of the use of a photocathode with a microchannel plate is in an image intensification device. The image intensification device is used in night vision devices to amplify low light levels so that a user may see even in very dark conditions. In the image intensification device, a photocathode produces electrons in response to photons from an image. The electrons are then accelerated to the microchannel plate, which produces secondary emission electrons in response. The secondary emission electrons are received at a phosphor screen or, alternatively, a charge coupled device (CCD), thus producing a representation of the original image.

Image intensification devices are constructed for a variety of applications, and, therefore, vary in both shape and size. These devices are particularly useful for both industrial and military applications. For example, image intensification devices are used in night vision goggles for enhancing the night vision of aviators and other military personnel performing covert operations. They are also employed in security cameras, photographing astronomical bodies and in medical instruments to help alleviate conditions such as retinitis pigmentosis, more commonly known as night blindness. Such an image intensifier device is exemplified by U.S. Pat. No. 5,084,780, entitled TELESCOPIC SIGHT FOR DAY/NIGHT VIEWING by Earl N. Phillips, issued on Jan. 28, 1992, and assigned to ITT Corporation, the assignee herein.

Image intensification devices are currently manufactured in two types, commonly referred to as Generation II (GEN 2) and Generation III (GEN 3) type image intensifier tubes. The primary difference between these two types of image intensifier tubes is in the type of photocathode employed in each. Image intensifier tubes of the GEN 2 type have a multi-alkali photocathode with a spectral sensitivity in the range of 400–900 nanometers (nm). This spectral range can be extended to the blue or red by modification of the multi-alkali composition and/or thickness. GEN 3 image intensifier tubes have a p-doped gallium arsenide (GaAs) photocathode that has been activated to negative electron affinity (NEA) by the absorption of cesium and oxygen on the surface. This material has approximately twice the quantum efficiency (QE) of the GEN2 photocathode. An extension of the spectral response to the near infrared can be accomplished by alloying indium with gallium arsenide.

A transmission type of photocathode refers to a photocathode in which light energy strikes a first surface and electrons are emitted from an opposite surface. Photocathodes as used in modern night vision systems operate in a transmission mode.

A conventional method of fabricating a negative electron affinity transmission device involves the synthesis of a single photosensitive material that is deposited or bonded onto a transparent substrate. Fabricating a photocathode for a GEN2 image intensification device involves the deposition of a bi-alkali material onto a glass substrate, or faceplate. The faceplate's optical properties are such that it is predominately transparent to light of wavelengths that are absorbed by the photosensitive material.

A similar method is used to fabricate a GEN3 photocathode by using a photosensitive single crystal semiconductor material, such as Gallium Arsenide (GaAs). The thin GaAs film is typically thermally bonded to the transparent faceplate, by methods known to those skilled in the art of making image intensifiers.

During operation of the image intensification device, a photon that passes through the faceplate may be absorbed by the photosensitive material and create an excited electron within the material with an energy transition equal to the absorbed photon energy. This electron may then diffuse to the photosensitive material/vacuum interface and be emitted into a vacuum with a finite probability. In the case of GEN3 GaAs photocathodes, photons that are transmitted through the faceplate glass with energy greater than the fundamental band gap energy of GaAs, may be absorbed and create excited electrons.

The bandwidth, or spectral photosensitivity range, for an ideal GEN3 GaAs photocathode spans the energy range from the transmission edge of the glass faceplate to the fundamental band gap energy of GaAs. For typical faceplate glass formulations, the high energy transmission edge is approximately 350 nm. The fundamental band gap energy for GaAs is 880 nm. An ideal spectral photosensitivity in terms of quantum efficiency (QE) may have the characteristics shown in FIG. 5.

In practice, however, defects in the GaAs material and at the GaAs/glass interface decrease the diffusion lifetime of photo excited electrons. This may drastically reduce the photo sensitivity (photo response), especially at the short wavelength region of FIG. 5. Reduction of defects near the GaAs/glass interface may be accomplished by monolithically depositing a lattice matched layer onto the GaAs absorption layer, which is transparent to the wavelengths of interest.

A lattice matched layer, commonly used, is a semiconductor material alloy $Al_xGa_{1-x}As$, also called a window layer. Using deposition techniques, high quality AlGaAs/GaAs interfaces may be produced that result in reduction of interface defects by several orders of magnitude. A known method is to deposit a window layer that has high optical transmission properties in the 350–900 nm range to achieve a broad spectral response. Typical GEN3 GaAs transmission photocathodes achieve a spectral response bandwidth of 500–900 nm, using an $Al_{0.8}Ga_{0.2}As$ alloy for the window layer composition.

An anti-reflective coating (ARC), such as $Si_3N_4$ may also be added at the glass/AlGaAs interface. This then results in layers of glass/$Si_3N_4$/$Al_{0.8}Ga_{0.2}As$/GaAs, which represent a conventional GEN3 transmission photocathode. The goal for this GEN3 photocathode, as well as a typical alkali metal GEN2 photocathode, is to maximize their spectral bandwidth photo-response.

A GEN 3 image intensifier tube according to the prior art is illustrated in FIG. 6. Image intensifier tube 10 includes an evacuated envelope or vacuum housing 22 having photocathode 12 disposed at one end of housing 22 and a phosphor-coated anode screen 30 disposed at the other end of housing 22. Microchannel plate 24 is positioned within vacuum housing 22 between photocathode 12 and phosphor screen 30. Photocathode 12 includes glass faceplate 14 coated on one side with an antireflection layer 16; an aluminum gallium arsenide ($Al_xGa_{1-x}As$) window layer 17; a gallium arsenide active layer 18; and a negative electron affinity coating 20.

Microchannel plate 24 is located within vacuum housing 22 and is separated from photocathode 12 by gap 34. Microchannel plate 24 is generally made from a thin wafer of glass having an array of microscopic channel electron multipliers extending between input surfaces 26 and output surfaces 28. The wall of each channel is formed of a secondary emitting material. Phosphor screen 30 is located on fiber optic element 31 and is separated from output surface 28 of microchannel plate 24 by gap 36. Phosphor screen 30 generally includes aluminum overcoat 32 to stop light reflecting from phosphor screen 30 from reentering the photocathode through the negative electron affinity coating 20.

In operation, photons from an external source impinge upon photocathode 12 and are absorbed in the GaAs active layer 18, resulting in the generation of electron/hole pairs. The electrons generated by photocathode 12 are subsequently emitted into gap 34 of vacuum housing 22 from the negative electron affinity coating 20 on the GaAs active layer 18. The electrons emitted by photocathode 12 are accelerated toward input surface 26 of microchannel plate 24 by applying a potential across input surface 26 of microchannel plate 24 and photocathode 12.

When an electron enters one of the channels of microchannel plate 24 at input surface 26, a cascade of secondary electrons is produced from the channel wall by secondary emission. The cascade of secondary electrons are emitted from the channel at output surface 28 of microchannel plate 24 and are accelerated across gap 36 toward phosphor screen 30 to produce an intensified image. Each microscopic channel functions as a secondary emission electron multiplier having an electron gain of approximately several hundred. The electron gain is primarily controlled by applying a potential difference across the input and output surfaces of microchannel plate 24.

Electrons exiting the microchannel plate 24 are accelerated across gap 36 toward phosphor screen 30 by the potential difference applied between output surface 28 of microchannel plate 24 and phosphor screen 30. As the exiting electrons impinge upon phosphor screen 30, many photons are produced per electron. The photons create an intensified output image on the output surface of the optical inverter or fiber optics element 31.

SUMMARY OF THE INVENTION

To meet this and other needs, and in view of its purposes, the present invention provides a photocathode having input and output sides including a first layer of semiconductor material having a first energy band gap for providing absorption of light of wavelengths shorter than or equal to a first wavelength, a second layer of semiconductor material having a second energy band gap for providing transmission of light of wavelengths longer than the first wavelength, and a third layer of semiconductor material having a third energy band gap for providing absorption of light of wavelengths between the first wavelength and a second wavelength, the first wavelength shorter than the second wavelength. The first, second and third layers are positioned in sequence between the input and output sides.

In another embodiment of the invention, an image intensifier receives light from an image at an input side and outputs light of the image at an output side. The imaging intensifier has a photocathode, positioned at the input side, including (a) a first layer of semiconductor material having a first energy band gap for providing absorption of light of wavelengths shorter than or equal to a first wavelength, (b) a second layer of semiconductor material having a second energy band gap for providing transmission of light of wavelengths longer than the first wavelength, (c) a third layer of semiconductor material having a third energy band gap for providing absorption of light of wavelengths between the first wavelength and a second wavelength, the first wavelength shorter than the second wavelength, and (d) the first, second and third layers are positioned in sequence from the input side. The image intensifier also has an imaging device positioned at the output side; and a microchannel plate positioned between the photocathode and the imaging device. The image intensifier provides a tuned spectral response with the first and second wavelengths defining cutoff wavelengths of the spectral response.

In yet another embodiment, the invention provides a method of making a photocathode including the steps of: (a) forming a first layer of semiconductor material having a first energy band gap for absorbing light of wavelengths shorter than or equal to a first wavelength; (b) forming a second layer of semiconductor material having a second energy band gap for transmitting light of wavelengths longer than the first wavelength; and (c) forming a third layer of semiconductor material having a third energy band gap for absorbing light of wavelengths between the first wavelength and a second wavelength, in which the first wavelength is shorter than the second wavelength. The method also includes bonding a sequence of the first, second and third layers to a transparent faceplate.

In still another embodiment, the invention provides a method of tuning a spectral response of a photocathode including the steps of: (a) forming a first layer of semiconductor material for absorbing light at wavelengths shorter than or equal to a first wavelength, by varying a first energy band gap of the first layer; (b) forming a second layer of semiconductor material for transmitting light at wavelengths longer than the first wavelength, by varying a second energy band gap of the second layer of semiconductor material; and (c) forming a third layer of semiconductor material for absorbing light at wavelengths between the first wavelength and a second wavelength, by varying a third energy band gap of the third layer of semiconductor material, in which the first wavelength is shorter than the second wavelength. The method also includes bonding a sequence of the first, second and third layers to a transparent faceplate.

It is understood that the foregoing general description and the following detailed description are exemplary, but are not restrictive, of the invention.

BRIEF DESCRIPTION OF THE DRAWING

This invention is best understood from the following detailed description when read in connection with the accompanying drawing. Included in the drawing are the following figures.

DETAILED DESCRIPTION OF THE INVENTION

As will be explained, the present invention provides a transmission NEA photocathode that has a tuneable photosensitivity, or a tuneable spectral-response characteristic. The spectral bandwidth and the spectral center wavelength may be tuned to desired values over a broad range. The invention provides short and long wavelength cutoffs, which may be tuned, without the need for external filtering optics.

Figure 1:
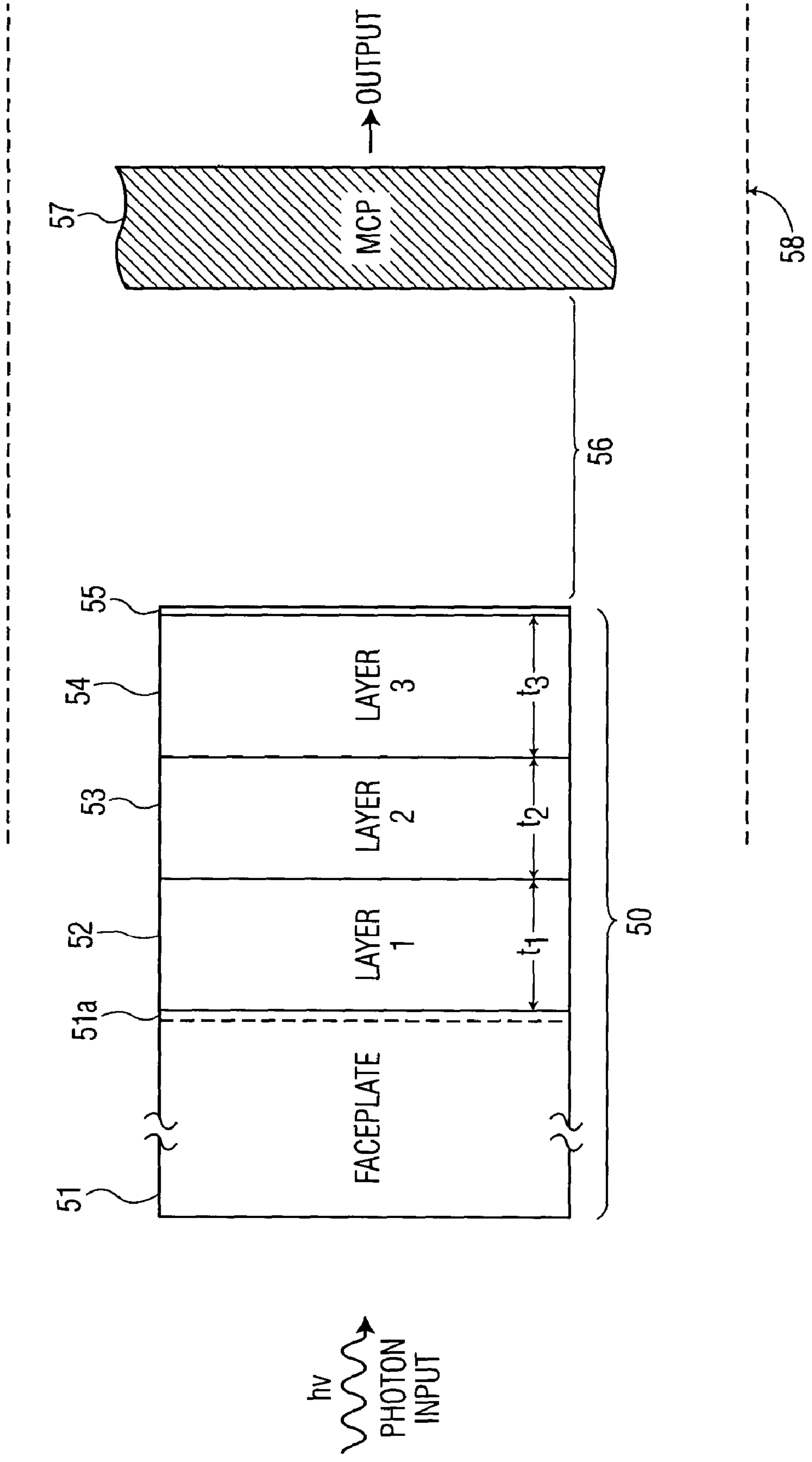
FIG. 1 is a cross sectional schematic diagram of a photocathode and a microchannel plate (MCP) disposed in a vacuum housing of an image intensifier, according to an embodiment of the invention.
Figure 6:
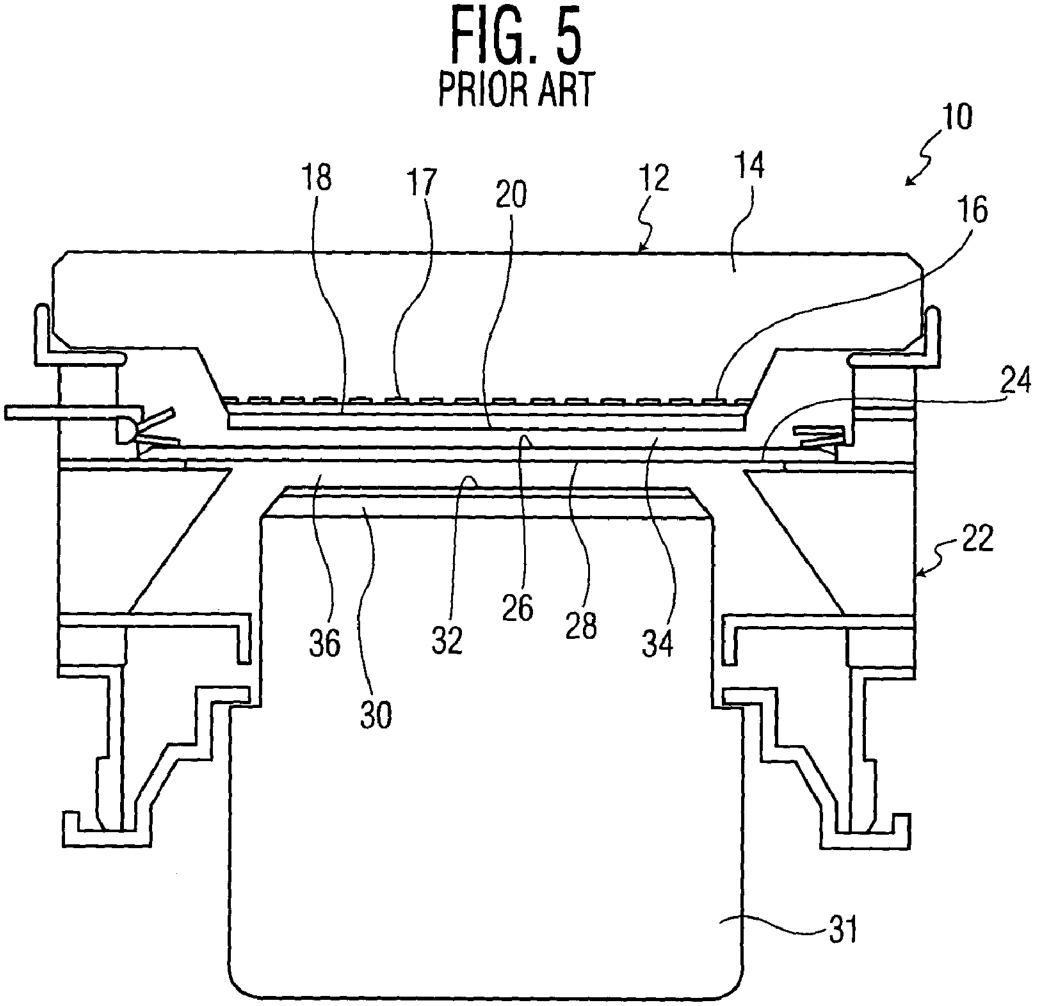
FIG. 6 PRIOR ART
FIG. 6 is a cross sectional schematic diagram of a conventional image intensifier, which may substitute a conventional photocathode with the photocathode of FIG. 1, according to an embodiment of the invention.

Referring to FIG. 1, there is shown a cross section of a NEA transmission photocathode, generally designated as 50, in accordance with an embodiment of the invention. As shown, photocathode 50 includes faceplate 51, layer 1 (52), layer 2 (53), layer 3 (54) and NEA layer 55. Photocathode 50 is inserted into vacuum housing 58, which may be similar to the manner in which photocathode 12 is inserted into vacuum housing 22 of FIG. 6. Microchannel plate 57 is also shown inserted into vacuum housing 58, in a manner similar to that of microchannel plate 24 shown inserted into vacuum housing 22 of FIG. 6. Gap 56, which is a vacuum, separates photocathode 50 and microchannel plate 57.

The transmission photocathode will now be described in more detail. Layer 1, designated 52, includes a high energy (short wavelength) semiconductor material. The material of layer 1 may be chosen such that the band gap ($Eg_1$) and thickness ($t_1$) result in a high absorption of light with energies equal to or greater than the desired high energy (short wavelength) cut-off. A semiconductor material that may achieve this result, for example, may be an alloy such as $Al_xGa_{1-x}As$. For example, an $Al_{0.35}Ga_{0.65}As$ layer having a thickness $t_1$ of 1 micrometer absorbs substantially light at a wavelength equal to or less than 650 nm.

The semiconductor material of layer 3 (designated 54) may be chosen to have a band gap ($Eg_3$) and thickness ($t_3$) to substantially absorb light with energies hv defined by $Eg_3<hv<Eg_1$. Layer 3 may also be chosen to have optical properties, defined by $Eg_3$ and $t_3$, which allow a high transmission of light with energies equal to or less than the desired long wavelength cut-off. For example, a semiconductor material that may achieve this result may be, but is not limit to, an alloy such as $Al_{0.08}Ga_{0.92}As$. When layer 3 is an $Al_{0.08}Ga_{0.92}As$ layer, a thickness $t_3$ of 2 microns substantially absorbs light of wavelengths shorter than 850 nm and transmits light of wavelengths longer than 850 nm.

Layer 3, as shown, abuts NEA layer 55 which provides the NEA vacuum emission material. Layer 55 may be a thin film of CsO (approximately 50–100 Angstrom), deposited on top of a cleaned surface of layer 3 (54), by methods known in the art. Accordingly, photo excited electrons in layer 3, resulting from photon absorption and creation of electron-hole pairs by light having energies greater than $Eg_3$, may diffuse through NEA layer 55 and be emitted into the vacuum space of gap 56.

To prevent photo excited electrons in Layer 1 (52) from diffusing to NEA layer 55, layer 2 (designated 53) may be interposed between layer 1 and layer 3, as shown in FIG. 1. Layer 2, therefore, may be an electron blocking semiconductor layer that is monolithically deposited between layer 1 and layer 3. The material properties of layer 2 may be chosen so that the band gap $Eg_2$ and thickness $t_2$ of layer 2 allow a substantial amount of light energies hv, defined by $Eg_3<hv<Eg_1$ to be transmitted into layer 3, and thus be absorbed by layer 3. The material properties of layer 2 may also be chosen so that the semiconductor energy band alignment between layer 1 and layer 2 produces a conduction band continuum that acts as a barrier to electron diffusion of photo excited electrons from layer 1 to layer 3. An example of a suitable material that meets these criteria is a semiconductor material AlAs (or $Al_{1.0}Ga_{0.0}As$). In addition, layer 2 properties may be chosen so that layer 2 does not exhibit any photosensitivity to light of energies $Eg_3<hv<Eg_1$. Layer 2 may have a thickness $t_2$ of 0.02 microns.

The thickness $t_1$ of layer 1 may range from 0.5 microns to 5 microns, with a preferred thickness $t_1$ of 1 micron. The thickness $t_2$ of layer 2 may range from 0.01 microns to 0.10 microns, with a preferred thickness of 0.02 microns. The thickness $t_3$ of layer 3 may range from 0.5 microns to 5 microns, with a preferred thickness of 2 microns.

Faceplate 51, disposed at the input side of vacuum housing 58, receives and transmits light. Light rays penetrate the faceplate and are directed to layer 1 (52) of the photocathode. Faceplate 51 may include glass that is transparent to the wavelengths of interest. Faceplate 51 may also be coated, as shown in FIG. 1, on one side with anti-reflection coating (ARC) layer 51*a*. It will be appreciated that ARC layer 51*a* may be omitted.

In some cases, the material chosen for layer 1 may re-emit photons, by photoluminescence processes, with energy approximately equal to $Eg_1$. These photons may be transmitted through layer 2 and be absorbed in layer 3, thus producing a photo response at a wavelength outside of a desired bandwidth. In order to reduce this effect, layer 1 parameters, such as free carrier concentration (semiconductor doping level) and thickness, may be set so that an energy band bending is intrinsically produced in layer 1, as illustrated in FIG. 2.

The energy band bending within layer 1 produces a built-in electric field that imposes a force (drift velocity) onto photo excited electrons within layer 1 accelerating the electrons towards the input ARC/glass interface (towards the left side of layer 1 in FIG. 1). In other words, the electrons fall back into the valley formed by the energy band bending within layer 1, shown in FIG. 2. It will be appreciated that the layer 1/ARC/glass (or $Al_xGa_{1-x}As$/ARC/glass) interface of FIG. 1 also creates a high density of defects in the semiconductor, at and near the interface. The characteristics of these defects are such that they act as non-radiative recombination sites. This process of energy relaxation is such that photo excited electron-hole pairs recombine, lose their excitation energy through non-radiative processes, and do not emit photons by the photoluminescence processes.

Figure 2:
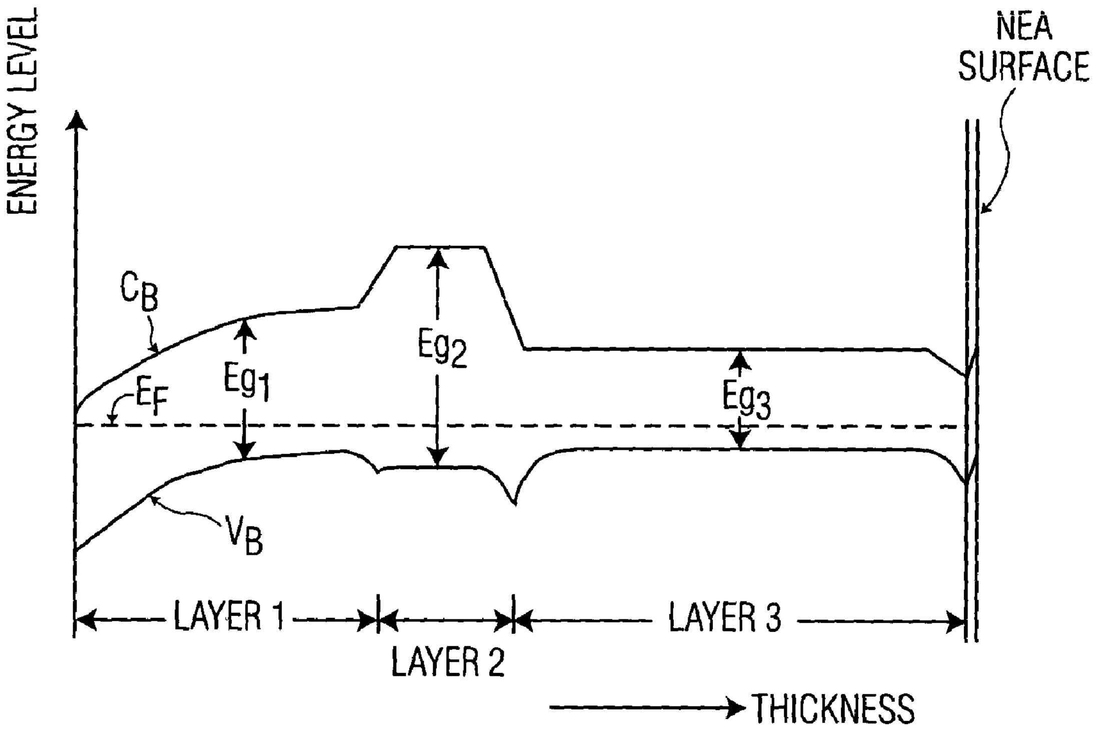
FIG. 2 is a plot of energy level versus thickness showing energy band gaps of three layers included in the photocathode of FIG. 1, according to an embodiment of the invention.

As shown in FIG. 2, energy level is plotted versus thickness. In the example shown, layer 1 has an energy band gap of $Eg_1$, layer 2 has an energy band gap of $Eg_2$, and layer 3 has an energy band gap of $Eg_3$. The band gap (distance between the conduction band ($C_B$) line and the valence band ($V_B$) line) of $Eg_1$ is greater than $Eg_3$ and the band gap of $Eg_2$ is greater than $Eg_1$ (i.e. $Eg_2 > Eg_1 > Eg_3$).

It will be appreciated that a layer absorbs light with energy greater than (or equal to) its band gap (Eg). When the input light to photocathode 50 has a wide range of energies, all light at energies greater than (or equal to) $Eg_1$ is absorbed in layer 1. Energies less than $Eg_1$ pass into layer 2. Since $Eg_1$ is smaller than $Eg_2$ of layer 2, the light also passes into layer 3. It is undesirable for the photocathode to produce a signal from the light absorbed in layer 1. Therefore, layer 2 acts as a barrier to electrons and prevents electron diffusion from layer 1 to NEA layer 55.

The energies of light passing into layer 3 from layer 1 (energies smaller than $Eg_1$) are absorbed in layer 3 in the range $Eg_1$ to $Eg_3$. Layer 3 is adjusted to produce a signal in the photocathode from light having energies in this range of $Eg_1$ to $Eg_3$.

By adjusting $Eg_1$, to be greater than (or equal to) $Eg_3$ and by adjusting $Eg_2$ to be greater than (or equal to) $Eg_1$, the invention produces a signal that has a very narrow band ($Eg_1 - Eg_3$ is a small value) or a wider band ($Eg_1 - Eg_3$ is a large value). In addition, the center wavelength of the spectral response may be moved to green light, red light, yellow light, etc.

Figure 3:
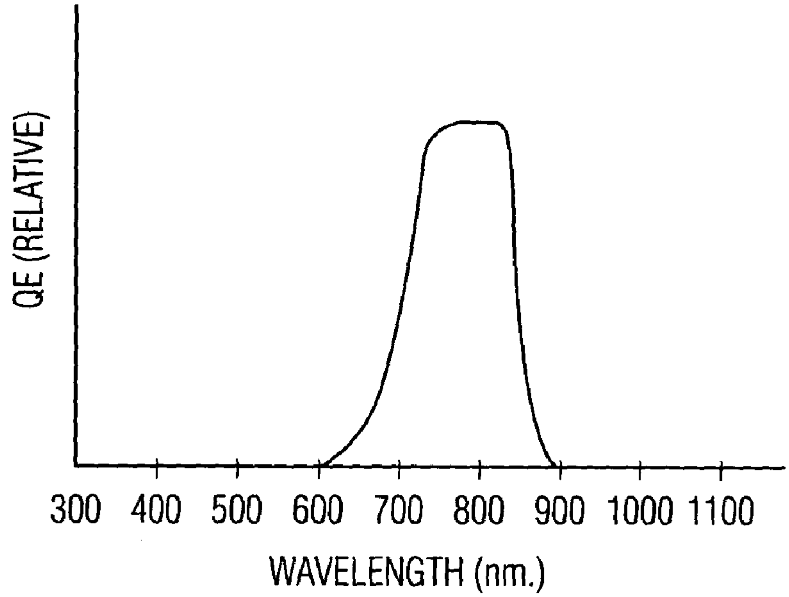
FIG. 3 is a plot of quantum efficiency versus wavelength showing a narrow spectral response of the photocathode of FIG. 1, according to an embodiment of the invention.

With the embodiment of the invention, as exemplified in FIG. 1, having layer 1 of 1 micron thickness, layer 2 of 0.02 micron thickness and layer 3 of 2 micron thickness, the invention produces a spectral response, in terms of quantum efficiency (QE), as shown in FIG. 3.

In another embodiment of the invention, thickness of each layer of the photocathode may be expressed in more general terms, which depend on various factors. For example, the thickness of layer 1 ($t_1$) may be such that a high percentage of input light photons, with energies greater than the band gap of the layer 1 material ($Eg_1$), are absorbed within layer 1. The percentage of absorbed photons is dependent on the optical properties of the material. A factor affecting the light absorption is the absorption coefficient of the material at the input wavelengths ($\alpha_1(\lambda)$). For absorption of at least 95% of input light, the layer thickness may nominally be a function of a product of $(t_1) \times \alpha_1(\lambda) \geqq 3$. It will be appreciated that this semiconductor optical property ($\alpha(\lambda)$) for various materials may be obtained from published data, or may be measured by methods known to those skilled in the art.

The thickness of layer 1 ($t_1$) may also depend on the free carrier concentration of layer 1 that produces a desired energy band bending, as shown in FIG. 2. This may be achieved by doping layer 1 at an appropriate free carrier concentration and, thus, produce the desired energy band bending (based on a layer 1 thickness determined from the criteria given above for appropriate photon absorption. Free carrier concentration may be achieved by doping the semiconductor during the synthesis phase of layer 1 fabrication.

The thickness of layer 2 ($t_2$) may be based on producing an effective electron blocking layer so that photo excited electrons produced in layer 1 do not diffuse through layer 2 and enter into layer 3. To satisfy this, layer 2 may be fabricated to provide an effective conduction energy band continuum barrier and be thicker than an electron tunneling thickness for the material of layer 2. For example, assuming that the semiconductor material AlAs is used for layer 2, the thickness of layer 2 may be greater than 0.02 microns to prevent electron tunneling through layer 2.

The thickness of layer 3 ($t_3$) may be based on a criteria similar to that discussed above for layer 1. The thickness of layer 3 may be chosen, using the optical properties of the material of layer 3 ($\alpha_3(\lambda)$), to provide a high percentage of light absorption at wavelength energies not absorbed in layer 1 and transmitted through layer 2, but having an energy greater than the band gap energy of layer 3. In addition to the light absorption criteria for layer 3, the photo excited electron diffusion length in layer 3 ($L_3$) may also be considered to determine the thickness of layer 3. As discussed previously, the photo excited electrons in layer 3 may diffuse to the NEA layer to achieve a desired signal. The diffusion length $L_3$ may be dependent on several material properties. Nominally, however, the thickness of layer 3 may be based on a criteria that $t_3 < 3 \times L_3$.

Another example of materials and material ranges for layers 1–3 of photocathode 50 is the following:

Layer 1 includes the material $Al_xGa_{1-x}As$, where the composition defined by "x" is between 0.05 and 0.9.

Layer 2 includes the material $Al_xGa_{1-x}As$, where the composition defined by "x" is between 0.1 and 1.0.

Layer 3 includes the material $Al_xGa_{1-x}As$, where the composition defined by "x" is between 0.00 and 0.4.

Yet another example of materials (where In is used instead of Al) and material ranges for layers 1–3 of photocathode 50 is the following:

Layer 1 includes the material $In_xGa_{1-x}P$, where the composition defined by "x" is between 0.4 and 0.6.

Layer 2 includes the material $In_xGa_{1-x}P$, where the composition defined by "x" is between 0.5 and 0.00.

Layer 3 includes the material $In_xGa_{1-x}As$, where the composition defined by "x" is between 0.00 and 0.3.

The spectral response of the photocathode may be tuned by moving the spectral response shown in FIG. 3 to approximate cut-off wavelengths of 725 nm and 910 nm (center wavelength 767 nm, approximately). This spectral response may be realized with the following composition:

layer 1—$Al_{0.20}Ga_{0.80}As$ layer 2—AlAs (Ga is 0)

layer 3—$In_{0.01}Ga_{0.99}As$

Figure 4:
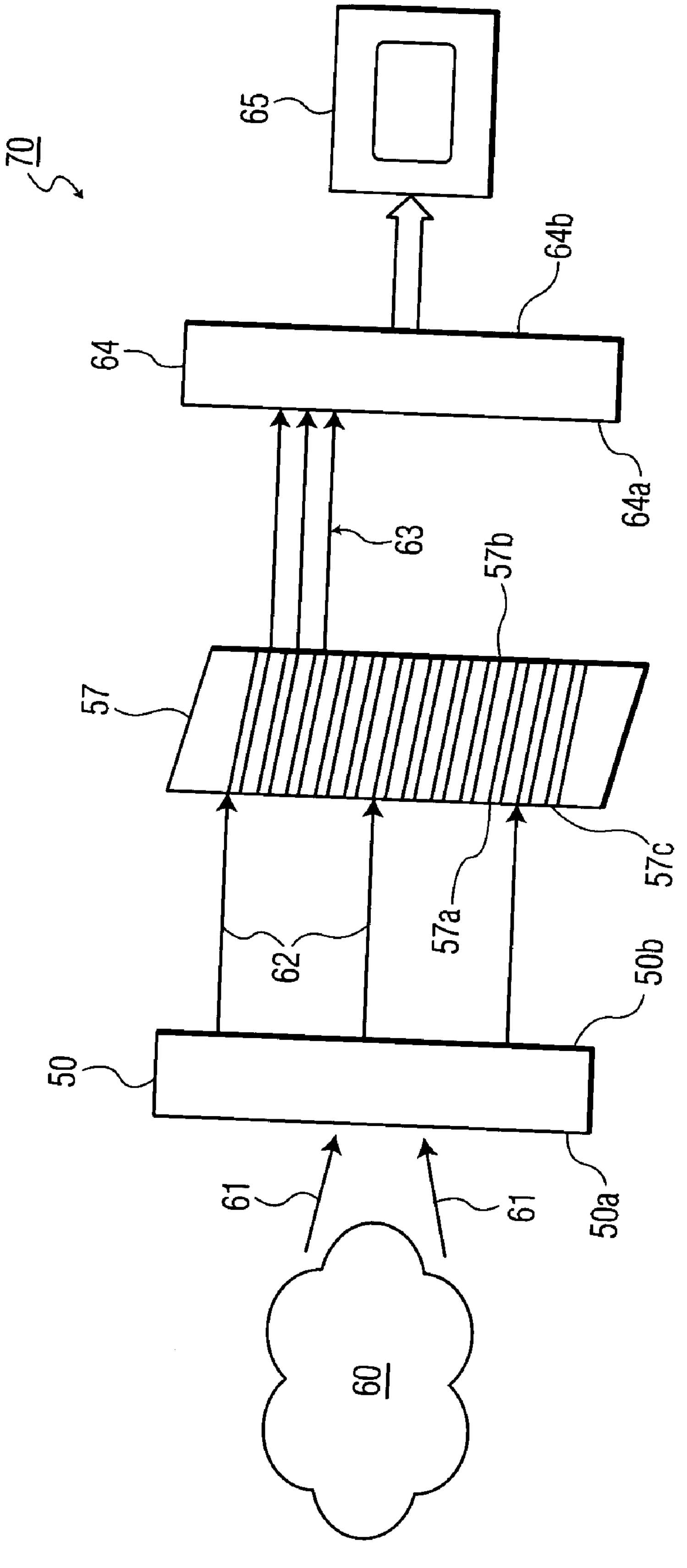
FIG. 4 is a schematic block diagram of an image intensifier employing the photocathode of FIG. 1, according to an embodiment of the invention.
Figure 5:
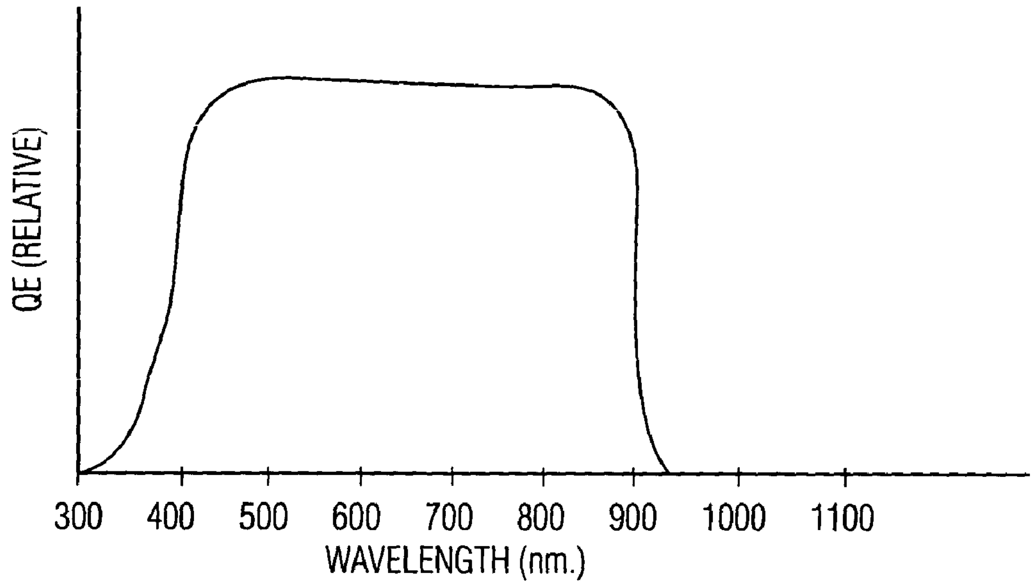
FIG. 5 PRIOR ART
FIG. 5 is a plot of quantum efficiency versus wavelength showing a typical wide spectral response of a conventional photocathode.

Referring to FIG. 4, there is shown image intensifier 70, according to an embodiment of the present invention. As shown, image intensifier 70 includes photocathode 50 having input side 50*a* and output side 50*b*. It will be understood that photocathode 50 includes faceplate 51, layers 1–3 (52–54) and NEA layer 55 (shown in FIG. 1). Photocathode 50 may also include ARC layer 51*a*. Image intensifier 70 also includes microchannel plate (MCP) 57 and imaging device 64. Microchannel plate 57 includes input side 57*a* and output side 57*b*. Imaging device 64 includes input side 64*a* and output side 64*b*. The imaging device may include a phosphor screen for direct viewing operations.

Imaging device 64 may be any type of solid-state imaging sensor. Preferably, solid-state imaging sensor 64 is a CCD device. More preferably, solid-state imaging sensor 64 is a CMOS imaging sensor. MCP 57 may be, but is not limited to a silicon or glass material. MCP 57 has a plurality of channels 57*c* formed between input surface 57*a* and output surface 57*b*. Channels 57*c* may have any type of profile, for example a round profile or a square profile. MCP 57 is connected to electron receiving surface 64*a* of imaging sensor 64.

Preferably, output surface 57*b* of MCP 57 is physically in contact with electron receiving surface 64*a* of imaging sensor 64. However, insulation may be necessary between MCP 57 and imaging sensor 64. Accordingly, a thin insulating spacer (not shown) may be inserted between output surface 57*b* of MCP 57 and electron receiving surface 64*a* of imaging sensor 64. The insulating spacer may be made of any electrical insulating material and is preferably formed as a thin layer, no more than several microns thick, deposited over electron receiving surface 64*a* of imaging sensor 64. For example, the insulating spacer may be, but is not limited to, an approximately 10 $\mu$m thick film. Alternatively, the insulating spacer may be a film formed on output surface 57*b* of MCP 57 (not shown).

Still referring to FIG. 4, in operation, light 61 from image 60 enters image intensifier 70, through input side 50*a* of photocathode 50. Photocathode 50 changes the entering light into electrons 62, which are output from output side 50*b* of photocathode 50. Electrons 62 exiting photocathode 50 enter channels 57*c* through input surface 57*a* of MCP 57. After electrons 62 bombard input surface 57*a* of MCP 57, secondary electrons are generated within the plurality of channels 57*c* of MCP 57. MCP 57 may generate several hundred electrons in each of channels 57*c* for each electron entering through input surface 57*a*. Thus, the number of electrons 63 exiting channels 57*c* is significantly greater than the number of electrons 62 that entered channels 57*c*. The intensified number of electrons 63 exit channels 57*c* through output side 57*b* of MCP 57, and strike electron receiving surface 64*a* of CMOS imaging device 64. The output of imaging device 64, which may be light detected by individual pixels of the device, may be stored in a register, then transferred to a readout register, amplified and displayed on video display 65.

The following are examples of uses for image intensifier 70 employing tuneable photocathode 50:

(1) A day-time active imaging system incorporating a laser for imaging the reflected laser light, while eliminating most of daytime light background (photocathode tuned to laser wavelength).

(2) A night-time active imaging system incorporating a laser for imaging the reflected laser light, while eliminating most urban lighting interferences (photocathode tuned to laser wavelength).

(3) An active imaging system incorporating a pulsed, gated, or modulated laser for imaging reflected light at a fixed or variable distance window, as seeing through fog (photocathode tuned to modulated laser wavelength).

(4) An active under water imaging system incorporating a pulsed, gated, or modulated blue laser for imaging reflected light at a fixed or variable distance window, to eliminate or reduce the effects of water turbidity on distortions and depth of field (photocathode tuned to modulated laser wavelength).

(5) An active under water imaging system incorporating a pulsed (gated) blue laser for imaging reflected light at a fixed distance window, to eliminate or reduce the effects of organic fluorescence background emissions on distortions and depth of field (photocathode tuned to modulated laser wavelength).

(6) An imaging system with sensitivity narrowly tuned to a particular laser wavelength for detection, while eliminating most background light (photocathode tuned to narrow bandwidth without use of photonic filtering devices).

(7) An active imaging system incorporating an excitation light source with imaging sensitivity tuned to a particular fluorescence emission band from an organic substance.

As used herein, the term "light" means electromagnetic radiation, regardless of whether or not this light is visible to the human eye. The image intensification process involves conversion of the received ambient light into electron patterns and projection of the electron patterns onto a phosphor screen for conversion of the electron patterns into light visible to the observer. This visible light may then be viewed directly by the operator or through a lens provided in the eyepiece of the system.

What is claimed:

1. A photocathode having input and output sides comprising a first layer of semiconductor material having a first energy band gap for providing absorption of light of wavelengths shorter than or equal to a first wavelength, a second layer of semiconductor material having a second energy band gap for providing transmission of light of wavelengths longer than the first wavelength, a third layer of semiconductor material having a third energy band gap for providing absorption of light of wavelengths between the first wavelength and a second wavelength, the first wavelength shorter than the second wavelength, the first, second and third layers are positioned in sequence between the input and output sides, and the first and second wavelengths, respectively, define first and second cutoff spectral response wavelengths, forming a predetermined tuned bandwidth.

2. The photocathode of claim 1 wherein the first, second and third layers each includes an alloy of $Al_xGa_{1-x}As$, in which a sum of x and 1−x equals a value of 1, and the value of x for each of the alloys of the first, second and third layers is different.

3. The photocathode of claim 2 wherein the value of x for the first layer varies between 0.05 and 0.9, the value of x for the second layer varies between 0.1 and 1.0, and the value of x for the third layer varies between 0.00 and 0.4.

4. The photocathode of claim 2 wherein the value of x for the alloy of the first layer has a value of 0.35, the value of x for the alloy of the second layer has a value of 1.00, and the value of x for the alloy of the third layer has a value of 0.08.

5. The photocathode of claim 2 wherein a first thickness of the first layer varies between 0.05 and 5 microns, a second thickness of the second layer varies between 0.01 and 0.1 microns, and a third thickness of the third layer varies between 0.5 and 5 microns.

6. The photocathode of claim 2 wherein the first thickness is greater than or equal to $3/\alpha_1(\lambda)$, where $\alpha_1(\lambda)$ is an absorption coefficient of the first layer at an input wavelength of $\lambda$, the second thickness is thicker than an electron tunneling thickness of the second layer, and the third thickness is less than $3 \times L_3$, where $L_3$ is an electron diffusion length of the third layer.

7. The photocathode of claim 1 including a glass faceplate positioned between the input side and the first layer.

8. The photocathode of claim 7 wherein the glass faceplate includes an anti-reflection coating (ARC) layer, the ARC layer abutting the first layer.

9. The photocathode of claim 1 including a negative electron affinity (NEA) layer positioned between the third layer and the output side.

10. The photocathode of claim 1 wherein the first wavelength is approximately 650 nm, and the second wavelength is approximately 850 nm.

11. The photocathode of claim 1 wherein the first, second and third layers each includes an alloy of $In_xGa_{1-x}P$, in which a sum of x and 1−x equals a value of 1, and the value of x for each of the alloys of the first, second and third layers is different.

12. The photocathode of claim 11 wherein the value of x for the first layer varies between 0.4 and 0.6, the value of x for the second layer varies between 0.5 and 0.00, and the value of x for the third layer varies between 0.00 and 0.3.

13. An image intensifier, receiving light from an image at an input side and outputting light of the image at an output side, the imaging intensifier comprising:

a photocathode, positioned at the input side, including (a) a first layer of semiconductor material having a first energy band gap for providing absorption of light of wavelengths shorter than or equal to a first wavelength, (b) a second layer of semiconductor material having a second energy band gap for providing transmission of light of wavelengths longer than the first wavelength, (c) a third layer of semiconductor material having a third energy band gap for providing absorption of light of wavelengths between the first wavelength and a second wavelength, the first wavelength shorter than the second wavelength, and (d) the first, second and third layers are positioned in sequence from the input side;

an imaging device positioned at the output side; and a microchannel plate positioned between the photocathode and the imaging device;

wherein the image intensifier provides a tuned spectral response with the first and second wavelengths defining cutoff wavelengths of the spectral response.

14. The image intensifier of claim 13 wherein the first energy band gap, the second energy band gap, and the third energy band gap are adjusted to provide the cutoff wavelengths of the spectral response.

15. The image intensifier of claim 14 wherein the spectral response is tuned to an active light source impinging an object to form the image received by the image intensifier.

16. The image intensifier of claim 15 wherein the active light source is one of a CW laser light source and a modulated laser light source.

17. The image intensifier of claim 14 wherein the spectral response is tuned to an image formed by fluorescence emission characteristic of a compound or a group of compounds.

* * * * *